(12) United States Patent
Nielsen

(10) Patent No.: US 11,277,110 B2
(45) Date of Patent: Mar. 15, 2022

(54) FAST FREQUENCY SWITCHING IN A RESONANT HIGH-Q ANALOG FILTER

(71) Applicant: Anlotek Limited, London (GB)

(72) Inventor: Jorgen Staal Nielsen, Calgary (CA)

(73) Assignee: Anlotek Limited, London (GB)

( * ) Notice: Subject to any disclaimer, the term of this patent is extended or adjusted under 35 U.S.C. 154(b) by 0 days.

(21) Appl. No.: 17/011,841

(22) Filed: Sep. 3, 2020

(65) Prior Publication Data

US 2021/0067125 A1 Mar. 4, 2021

Related U.S. Application Data

(60) Provisional application No. 62/895,430, filed on Sep. 3, 2019.

(51) Int. Cl.
*H03H 7/12* (2006.01)
*H03H 11/12* (2006.01)
*H03G 3/30* (2006.01)

(52) U.S. Cl.
CPC ............ *H03H 7/12* (2013.01); *H03G 3/3052* (2013.01); *H03H 11/1208* (2013.01); *H03H 2210/012* (2013.01); *H03H 2210/015* (2013.01); *H03H 2210/025* (2013.01)

(58) Field of Classification Search
CPC ........................................................ H03H 7/12
See application file for complete search history.

(56) References Cited

U.S. PATENT DOCUMENTS

| | | |
|---|---|---|
| 5,220,686 A | 6/1993 | Kasperkovitz et al. |
| 5,291,159 A | 3/1994 | Vale |
| 5,311,198 A | 5/1994 | Sutton |
| 5,854,593 A | 12/1998 | Dykema et al. |
| 5,917,387 A | 6/1999 | Rice et al. |
| 5,949,290 A | 9/1999 | Bertram |
| 6,057,735 A | 5/2000 | Cloutier |
| 6,236,281 B1 | 5/2001 | Nguyen et al. |
| 6,452,465 B1 | 9/2002 | Brown et al. |

(Continued)

FOREIGN PATENT DOCUMENTS

| | | |
|---|---|---|
| CN | 102098018 A | 6/2011 |
| CN | 104538714 A | 4/2015 |

(Continued)

OTHER PUBLICATIONS

Anis, M., et al., "Fully Integrated Super-Regenerative Bandpass Filters for 3.1-to-7GHz Multiband UWB System," Proceedings of the IEEE International Symposium on VLSI Design, Automation and Test (VLSI-DAT), Apr. 23-25, 2008, Hsinchu, Taiwan, 4 pages.

(Continued)

*Primary Examiner* — Hai L Nguyen
(74) *Attorney, Agent, or Firm* — Christensen O'Connor Johnson Kindness PLLC

(57) ABSTRACT

A variable filter and method of switching a resonant frequency of the variable filter from an initial frequency to a desired frequency, where the variable filter has a tunable frequency and a variable Q. With the variable filter operating at the initial frequency and an initial Q, the variable filter is Q-spoiled toward a low-Q state. The variable filter is tuned toward the desired frequency and the tunable resonator is Q-enhanced from the low-Q state to achieve a desired filter response.

17 Claims, 7 Drawing Sheets

(56) References Cited

U.S. PATENT DOCUMENTS

| | | | |
|---|---|---|---|
| 6,496,075 | B2 | 12/2002 | Justice et al. |
| 6,587,007 | B2 | 7/2003 | Exeter |
| 6,650,195 | B1 | 11/2003 | Brunn et al. |
| 6,771,147 | B2 | 8/2004 | Mongia |
| 6,898,450 | B2 | 5/2005 | Eden et al. |
| 6,920,315 | B1 | 7/2005 | Wilcox et al. |
| 6,941,118 | B2 | 9/2005 | Yamamoto |
| 6,954,774 | B1 | 10/2005 | Mulbrook |
| 7,098,751 | B1 | 8/2006 | Wong |
| 7,158,010 | B2 | 1/2007 | Fischer et al. |
| 7,174,147 | B2 | 2/2007 | Toncich et al. |
| 7,400,203 | B2 | 7/2008 | Ojo et al. |
| 7,414,779 | B2 | 8/2008 | Huber et al. |
| 7,423,502 | B2 | 9/2008 | Razafimandimby et al. |
| 7,433,668 | B2 | 10/2008 | Fischer et al. |
| 7,522,016 | B2 | 4/2009 | Toncich et al. |
| 7,917,117 | B2 | 3/2011 | Zafonte |
| 8,000,379 | B2 | 8/2011 | Kishigami et al. |
| 8,106,727 | B2 | 1/2012 | Kawai et al. |
| 8,120,536 | B2 | 2/2012 | Lindmark |
| 8,140,033 | B2 | 3/2012 | Chan Wai Po et al. |
| 8,253,514 | B2 | 8/2012 | Kharrat et al. |
| 8,294,537 | B2 | 10/2012 | Kawai et al. |
| 8,565,671 | B2 | 10/2013 | Robert et al. |
| 8,767,871 | B2 | 7/2014 | Park et al. |
| 8,922,294 | B2 | 12/2014 | Tsuzuki et al. |
| 8,981,875 | B2 | 5/2015 | Park |
| 9,024,709 | B2 | 5/2015 | Joshi et al. |
| 9,129,080 | B2 | 9/2015 | Tsuzuki et al. |
| 9,184,498 | B2 | 11/2015 | Schiller |
| 9,231,712 | B2 | 1/2016 | Hahn et al. |
| 9,407,239 | B2 | 8/2016 | White et al. |
| 9,634,390 | B2 | 4/2017 | Onaka |
| 9,698,747 | B2 | 7/2017 | Ishizuka |
| 10,050,604 | B2 * | 8/2018 | Nielsen ............ H03G 3/3042 |
| 10,236,899 | B1 | 3/2019 | Tope et al. |
| 10,396,807 | B1 | 8/2019 | Dai et al. |
| 10,879,875 | B2 * | 12/2020 | Nielsen ............ H03H 11/1291 |
| 2001/0043116 | A1 | 11/2001 | Waltman |
| 2005/0003785 | A1 | 1/2005 | Jackson et al. |
| 2007/0010217 | A1 | 1/2007 | Takahashi et al. |
| 2007/0296513 | A1 | 12/2007 | Ruile et al. |
| 2009/0322445 | A1 | 12/2009 | Raidl et al. |
| 2010/0097152 | A1 | 4/2010 | Wang et al. |
| 2010/0141355 | A1 | 6/2010 | Kharrat et al. |
| 2011/0187448 | A1 | 8/2011 | Koechlin |
| 2013/0065542 | A1 | 3/2013 | Proudkii |
| 2013/0142089 | A1 | 6/2013 | Azarnaminy et al. |
| 2013/0293291 | A1 | 11/2013 | Shanan |
| 2014/0266454 | A1 | 9/2014 | Testi et al. |
| 2014/0361839 | A1 | 12/2014 | Scott et al. |
| 2016/0072442 | A1 | 3/2016 | Testi et al. |
| 2016/0164481 | A1 | 6/2016 | Madan et al. |
| 2017/0149411 | A1 | 5/2017 | Nielsen et al. |
| 2020/0014382 | A1 | 1/2020 | Ranta |

FOREIGN PATENT DOCUMENTS

| | | |
|---|---|---|
| EP | 1675263 A1 | 6/2006 |
| GB | 2 403 086 A | 12/2004 |
| GB | 2 478 585 A | 9/2011 |
| GB | 2 494 652 A | 3/2013 |
| WO | 01/89081 A2 | 11/2001 |
| WO | 02/087071 A2 | 10/2002 |
| WO | 2011/103108 A1 | 8/2011 |
| WO | 2015/176041 A1 | 11/2015 |
| WO | 2018/215973 A1 | 11/2018 |

OTHER PUBLICATIONS

Anis, M., et al., "Low Power Complementary-Colpitts Self-Quenched Super-Regenerative Ultra-Wideband (UWB) Bandpass Filter in CMOS Technology," Proceedings of the IEEE MTT-S International Microwave Symposium Digest, Jun. 15-20, 2008, Atlanta, pp. 1047-1049.

Bahl, I.J., "High-Performance Inductors," IEEE Transactions on Microwave Theory and Techniques 49(4):654-664, Apr. 2001.

Bhattacharya, A., et al., "A 1.3-2.4-GHz 3.1-mW VCO Using Electro-Thermo-Mechanically Tunable Self-Assembled MEMS Inductor on HR Substrate," IEEE Transactions on Microwave Theory and Techniques 33(2):459-469, Feb. 2015.

Chen, J.-Y., et al., "A Fully Integrated Auto-Calibrated Super-Regenerative Receiver in 0.13-μm CMOS," IEEE Journal of Solid-State Circuits 42(9):1976-1985, Sep. 2007.

Chen, Y.-M., et al., "A 1-1.5 GHz Broadband Tunable Bandpass Filter," Proceedings of the Asia-Pacific Microwave Conference (APMC), Kaohsiung, Taiwan, Dec. 4-7, 2012, pp. 738-740.

Duncan, R., et al., "A Q-Enhanced Active-RLC Bandpass Filter," IEEE Transactions on Circuits and Systems—II: Analog and Digital Signal Processing 44(5):341-347, May 1997.

Entesari, K., et al., "A 25-75-MHz RF Mems Tunable Filter," IEEE Transactions on Microwave Theory and Techniques 55(11):2399-2405, Nov. 2007.

Frey, D.R., "Improved Super-Regenerative Receiver Theory," IEEE Transactions on Circuits and Systems—I: Regular Papers 60(12):3267-3278, Dec. 2013.

Georgescu, B., et al., "Tunable Coupled Inductor Q-Enhancement for Parallel Resonant LC Tanks," IEEE Transactions on Circuits and Systems—II: Analog and Digital Signal Processing 50(10):705-713, Oct. 2003.

Guyette, A.C., "Alternative Architectures for Narrowband Varactor-Tuned Bandpass Filters," Proceedings of the European Microwave Conference (EuMC), Rome, Sep. 29-Oct. 1, 2009, pp. 1828-1831.

He, X., and W.B. Kuhn, "A Fully Integrated Q-Enhanced LC Filter With 6 dB Noise Figure at 2.5 GHz in SOI," Proceedings of the IEEE Radio Frequency Integrated Circuits (RFIC) Symposium, Fort Worth, Texas, Jun. 6-8, 2004, pp. 643-646.

International Search Report and Written Opinion dated Feb. 8, 2017, issued in corresponding International Application No. PCT/GB2016/053686, filed Nov. 23, 2016, 10 pages.

Kuhn, W.B., et al., "Q-Enhanced LC Bandpass Filters for Integrated Wireless Applications," IEEE Transactions on Microwave Theory and Techniques 46(12):2577-2586, Dec. 1998.

Luo, X., et al., "Tunable Bandpass Filter With Two Adjustable Transmission Poles and Compensable Coupling," IEEE Transactions on Microwave Theory and Techniques 62(9):2003-2013, Sep. 2014.

Nosrati, M., and Z. Atlasbaf, "A New Miniaturized Electronically Tunable Bandpass Filter," Proceedings of the Seventh International Symposium on Antennas, Propagation & EM Theory (ISAPE '06), Guilin, China, Oct. 26-29, 2007, 5 pages.

Piazza, G., "Mems Resonators for Frequency Control and Sensing Applications," presentation, University of Pennsylvania, Philadelphia [at least as early as Apr. 24, 2015], 104 pages.

Psychogiou, D., et al., "V-Band Bandpass Filter With Continuously Variable Centre Frequency," IET Microwaves, Antennas & Propagation 7(8):701-707, Jun. 2013.

Quednau, P., et al., "A Small Size Low Cost Electronically Tunable Bandpass Filter With Integrated Bias Control," Proceedings of the IEEE International Conference on Microwaves, Communications, Antennas and Electronic Systems (COMCAS), Tel Aviv, Israel, Oct. 21-23, 2013, 4 pages.

Ramadan, A.H., et al., "A Narrowband Frequency-Tunable Antenna for Cognitive Radio Applications," Proceedings of the Sixth European Conference on Antennas and Propagation (EuCAP), Mar. 26-30, 2012, Prague, 5 pages.

Ramadan, A.H., et al., "A Tunable Filtenna for Cognitive Radio Applications," Proceedings of the Ninth European Conference on Antennas and Propagation (EuCAP), Apr. 13-17, 2015, Lisbon, Portugal, 2 pages.

Soorapanth, T., and S.S. Wong, "A 0-dB IL 2140 ± 30 MHz Bandpass Filter Utilizing Q-Enhanced Spiral Inductors in Standard CMOS," IEEE Journal of Solid-State Circuits 37(5):579-586, May 2002.

(56) References Cited

OTHER PUBLICATIONS

Sunca, A., et al., "A Wide Tunable Bandpass Filter Design Based on CMOS Active Inductor," Proceedings of the Eighth Conference on Ph.D. Research in Microelectronics and Electronics (PRIME), Session TF3—Microwave and RF, Aachen, Germany, Jun. 12-15, 2012, pp. 203-206.

Wang, S., and R.-X. Wang, "A Tunable Bandpass Filter Using Q-Enhanced and Semi-Passive Inductors at S-Band n 0 18-μM CMOS," Progress in Electromagnetics Research B 28:55-73, 2011.

Written Opinion of the International Preliminary Examining Authority dated Feb. 5, 2018, issued in corresponding International Application No. PCT/GB2016/053686, filed Nov. 23, 2016, 6 pages.

He, X., and W.B. Kuhn, "A 2.5-GHz Low-Power, High Dynamic Range, Self-Tuned Q-Enhanced LC Filter in SOI," IEEE Journal of Solid-State Circuits, vol. 40, No. 8, Aug. 2005, 1618-1628.

Gao, W. and W.S. Snelgrove, "A 950MHz Second-Order Integrated LC Bandpass Modulator" 1997 Symposium on VLSI Circuits Digest of Technical Papers, p. 111-112.

\* cited by examiner

FAST FREQUENCY SWITCHING IN A RESONANT HIGH-Q ANALOG FILTER

TECHNICAL FIELD

This relates to tuning variable filters, and in particular, tuning from an initial frequency to a desired frequency.

BACKGROUND

Tunable RF filters are useful in various applications, such as in signal conditioning and communications systems. Some examples of tunable band pass filters are described in U.S. Pat. No. 10,050,604 (Nielsen et al.) entitled "Variable Filter".

To improve system efficiencies and security, it is desirable to minimize the time it takes to switch to another frequency. Examples of filters that attempt to improve switching speed include U.S. Pat. No. 9,711,833 (Shapoury et al.) entitled "Tunable RF anti-jamming system (TRAJS)", and U.S. Pat. No. 6,909,344 (Toncich) entitled "Band Switchable Filter".

SUMMARY

According to an aspect, there is provided a method of switching a resonant frequency of a variable filter from an initial frequency to a desired frequency, the variable filter comprising an active feedback bandpass filter having a tunable frequency and a variable Q, the method comprising the steps of: with the variable filter operating at the initial frequency and an initial Q, Q-spoiling the variable filter toward a low-Q state, and tuning the variable filter toward the desired frequency and Q-enhancing the tunable resonator from the low-Q state to achieve a desired filter response.

According to other aspects, the method may comprise one or more of the following features, alone or in combination: the variable filter may comprise a signal loop connected between a signal input and a signal output, the signal loop comprising at least a tunable resonator and a variable gain block; Q-spoiling the variable filter may comprise reducing a gain factor of the gain block; variable filter may be tuned toward the desired frequency as the variable filter is Q-enhanced from the low-Q state; the method may further comprise the steps of Q-enhancing the variable filter to cause the variable filter to operate in an oscillation state, and then decreasing the Q to achieve the desired filter response; and the tunable resonator may be Q-spoiled sufficiently to permit the variable filter to switch from the initial frequency to the desired frequency within a time period of less than 100 nanoseconds or less.

According to an aspect, there is provided a method of switching a resonant frequency of a variable filter from an initial frequency to a desired frequency, the variable filter comprising an active feedback bandpass filter having a tunable frequency and a variable Q, wherein in operation, the variable frequency is described by one or more poles in an s-plane plot having a real axis and a jω axis, the method comprising the steps of: with the variable filter operating at an initial pole location in the s-plane plot, Q-spoiling the variable filter to cause one or more poles to move away from the jω axis and toward a low-Q state, and tuning the tunable frequency and controlling the variable Q to achieve a desired pole location corresponding to the desired frequency and a desired Q.

According to other aspects, the method may comprise one or more of the following features, alone or in combination: achieving the desired pole location may comprise Q-enhancing the variable filter relative to the low-Q state; the tunable frequency may be tuned toward the desired frequency while the variable filter is Q-enhanced from the low-Q state; the variable filter may comprise a signal loop connected between a signal input and a signal output, the signal loop comprising at least a tunable resonator and a variable gain block, and wherein Q-spoiling the variable filter may comprise reducing a gain factor of the variable gain block; the desired pole location may be achieved by increasing the gain factor of the gain block to cause the tunable resonator to operate in an oscillation state, and then decreasing the gain factor to a resonant state of the tunable resonator; and the low-Q state may be selected to permit the variable filter to switch from the initial frequency to the desired frequency within a time period of less than 100 nanoseconds.

According to an aspect, there is provided a variable filter, comprising an active feedback bandpass filter comprising a signal loop connected between a signal input and a signal output, the signal loop comprising at least a tunable resonator and a variable gain block, the signal loop generating a filter response, and a controller connected to tune a frequency of the tunable resonator and vary a gain factor of variable gain block, the controller being programmed to tune the filter response of the signal loop from an initial frequency to a desired frequency by: Q-spoiling the tunable resonator toward a low-Q state, and from the low-Q state, tuning the tunable resonator toward the second resonant frequency and Q-enhancing the tunable resonator state to achieve a desired Q at the second resonant frequency.

According to other aspects, the method may comprise one or more of the following features, alone or in combination: Q-spoiling the tunable resonator may comprise reducing a gain factor of the gain block; the controller may be programmed to tune the tunable resonator toward the desired frequency while Q-enhancing the tunable resonator from the low-Q state; the controller may be programmed to Q-enhance the tunable resonator from the low-Q state to cause the tunable resonator to operate in an oscillation state, and then decrease the gain factor to achieve the desired Q at the second resonant frequency; and the low-Q state may be sufficient to permit the signal loop to switch from the initial frequency to the desired frequency within a time period of less than 100 nanoseconds or less.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION OF PREFERRED EMBODIMENTS

Figure 1:
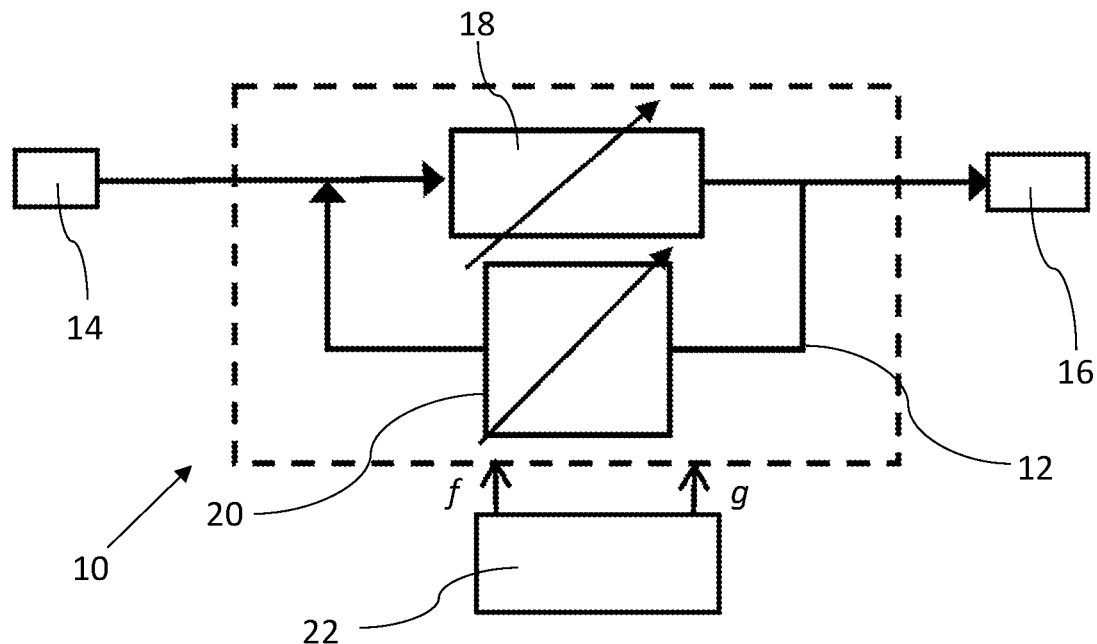
FIG. 1 is a schematic diagram of a variable filter with a tunable resonator and variable gain block.

A variable filter, generally identified by reference numeral 10, will now be described with reference to FIG. 1 through 10 along with a method for tuning the variable filter. The variable filter, such as an active feedback variable filter, and method may be used for analog RF (radio frequency), microwave and millimeter wave, and higher or lower electromagnetic frequency filtering applications.

The variable filter and method described herein may be used to reduce the switching speed from one resonant bandpass response at a first frequency to another resonant bandpass response at a second frequency.

An example of a suitable variable filter design may include a tunable bandpass filter implemented with tunable LC tank circuits with variable active feedback across the tank, although other tunable resonators may also be used. U.S. Pat. No. 10,050,604 (Nielsen et al.) entitled "Variable Filter", incorporated herein by reference, includes various circuit designs that may be useful in implementing a variable filter. For example, higher order and more complex filter circuits may be designed by including additional resonators, and selective design of circuit loops, or feedback paths, with variable gain elements.

These filter circuits may be described as active feedback bandpass filter (AFF), in which the resonant signal is recirculated back into the resonator with gain in the signal loop as shown in FIG. 1. Appropriate design permits relatively high Q to be achieved.

Referring to FIG. 1, variable filter 10 is shown with a tunable resonator element 18 and a variable scaling block 20 within a signal loop 12 between an input and an output 16. This circuit allows for both frequency and Q control using a controller 22 that is connected to tune the frequency f of tunable resonator 18 and vary the gain factor g of variable gain block 20. Scaling block 20 is in a signal loop 12 with resonator 18, such as in a feedback loop across resonator element 18 as shown. Scaling block 20 may have positive or negative gain. Controller 22 may be programmed to perform the steps described herein in order to switch the variable filter from one resonant frequency to another resonant frequency.

Higher order filters that use multiple filters, or combinations of the variable resonator shown in FIG. 1 may also be used. Nielsen et al. also describes other circuits with additional resonators, resulting in one or more dominant resonator poles in the left-hand side of the s-plane.

Examples of variable filters may include active multi-resonator feedback bandpass filters (MRF), which may include combinations of the core resonator module shown in FIG. 1 in various architectures, as described in Nielsen et al. The core resonator creates the pole-pair left of the jω axis, shown on the right side of FIG. 2. For simplicity, only the pole in the upper half of the complex plane will be considered below.

The concepts described herein regarding the generalized active feedback bandpass filter (AFF) implementation may apply to both bidirectional and unidirectional signal flow. However, only examples of the unidirectional version will be discussed herein, such as the generalized resonator shown in FIG. 3.

Figure 2:
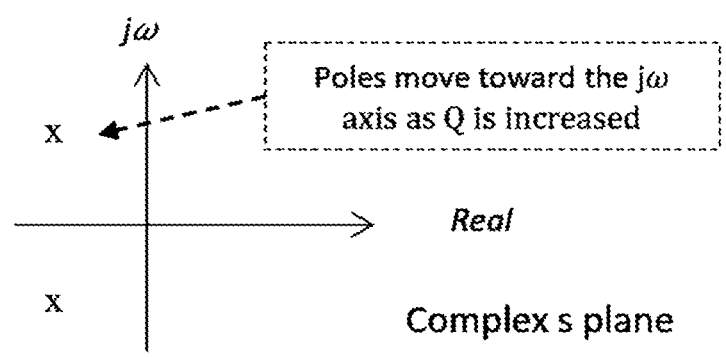
FIG. 2 is an s-plane plot showing the poles of the variable filter.

As the Q enhancement becomes more aggressive, the feedback places the closed loop resonant pole ever closer to the complex plane jω axis in the left-hand s-plane as depicted in FIG. 2. As multiple resonator modules are incorporated in order to widen the passband, as discussed in Nielsen et al., the control of all poles becomes more complex.

Transfer Function Analysis

Figure 3:
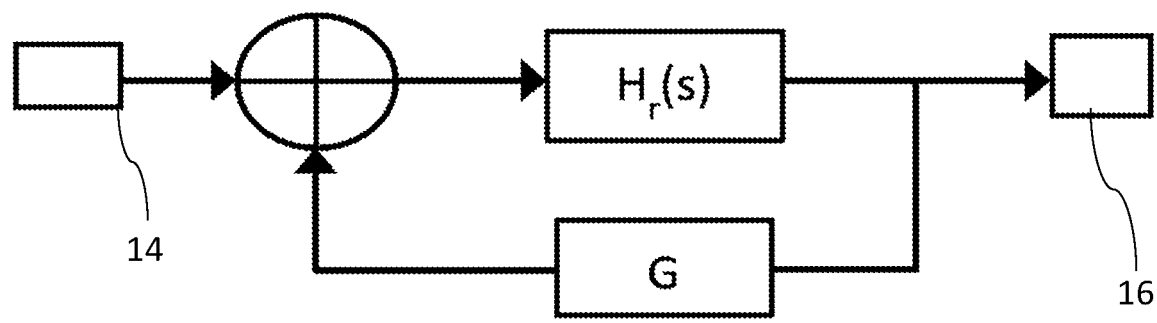
FIG. 3 is a schematic diagram of a generalized variable filter.

The closed loop variable filter of FIG. 1 may be represented as two cascaded transfer functions depicted in FIG. 3, generalizing the concept of the resonator module transfer function $H_r(s)$ and the scaling, or gain, block providing a gain of G. In particular, $H_r(s)$ is the frequency dependent network, G is the scaling block with either positive or negative scaling, and s denotes the complex frequency.

The $H_r(s)$ block may be adjustable to generate a variable frequency response, such as a resonator with a variable tuning element. The scaling block gain G may also be adjustable. In one example, the circuit may be an AFF that is Q-enhanced with active feedback to realize a more narrow band filter response centered at the desired frequency, $f_d$.

$H_r(s)$ contains the components of the circuit that are frequency dependent. Hence, in addition to including the frequency dependence of the resonators, $H_r(s)$ may also include phase shifts due to the excess loop delay (excess implying that they are not related to the resonator phase shift due to propagation delays), and any frequency dependence of the active components, such as the gain block.

Figure 4:
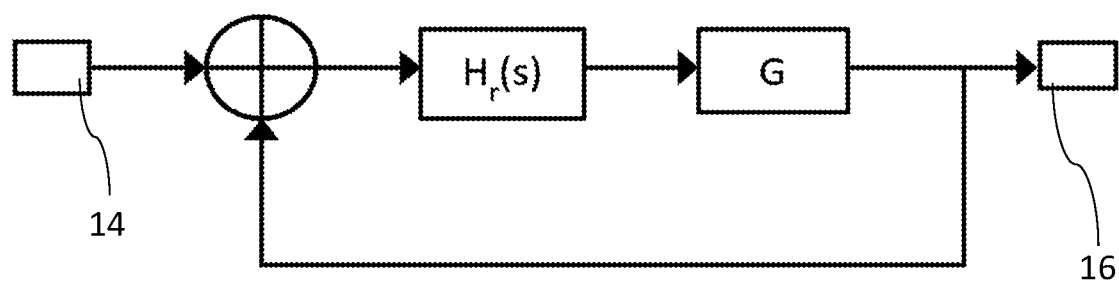
FIG. 4 is a schematic diagram of an alternate generalized variable filter.

For convenience, a normalization is assumed such that specifically at $f_d$, $|H_r(s)|=1$ and $|G|<1$ for a stable filter response. Also, specifically at $f_d$, with $|G|=1$ the AFF will be marginally stable, and for $|G|>1$ it will be unstable. The mathematics are a bit simpler if the transfer functions of the variable filter are reorganized as shown in FIG. 4, where $H_r(s)$ is in series with G.

G is approximated as being frequency independent as indicated by the absence of dependence on s. Hence G really implies the net gain applied to the loop which includes the losses in the loop. Initially G will be approximated as being independent of the signal passing through it.

The single resonator module of FIG. 2 is a two-port device with a transfer function given in the Laplace domain, denoted as a standard second order bandpass transfer function $H_r(S)$, operating at frequency $\omega_o$, is given as:

$$H_r(s) = \frac{s 2\omega_o D}{s^2 + s 2\omega_o D + \omega_o^2}$$

The term D in the denominator contains the impact of the scaling block feedback gain. The 'Q control' in FIG. 1 may comprise a control device (not shown) associated with the resonator module that controls the component Q of the capacitance or the inductance of the resonant cavity. If the Q control increases the component Q, this is referred to herein as Q-enhancement. If the Q control decreases the component Q of the resonant cavity, this is referred to herein as Q-spoiling.

Q-enhancement is equivalent to decreasing D, thus moving the resonant pole in FIG. 2 closer to the jω axis of the S-plane. Q-spoiling is equivalent to increasing D, thus moving the resonant pole of R further from the axis hence increasing D. As described in Nielsen et al., Q-enhancement and Q-spoiling may be used to move a resonant pole towards or away from the jω axis.

The scaling block shown in FIG. 1 is provided to enable better control over the feedback response. The gain factor for the variable scaling block may be variable between both positive and negative gain values. For example, if the gain of the scaling block is greater than zero, there results Q-enhancement. If the gain of the scaling block is less than zero, there results Q-spoiling.

The closed loop response which provides the actual filter frequency response may be represented as:

$$H_{AFF}(s) = \frac{GH_r(s)}{1 - GH_r(s)}$$

It can be shown that the closed loop transfer function for both variable filter circuits FIG. 3 and FIG. 4 have the same denominator:

$$(1 - GH_r(s))$$

This shows that the poles of each circuit are at the same location in the S plane. The numerators of the transfer function differ only by the magnitude of the scaling factor G.

Referring to FIG. 4, the closed loop transfer function from the input to the output may be given as:

$$H_{cl}(s) = \frac{GH_r(s)}{(1 - GH_r(s))}$$

where the Nyquist stability contour is $$\frac{1}{G} = H_r(s)$$

which represents the boundary between the stable and unstable regions in the complex plane.

Figure 5:
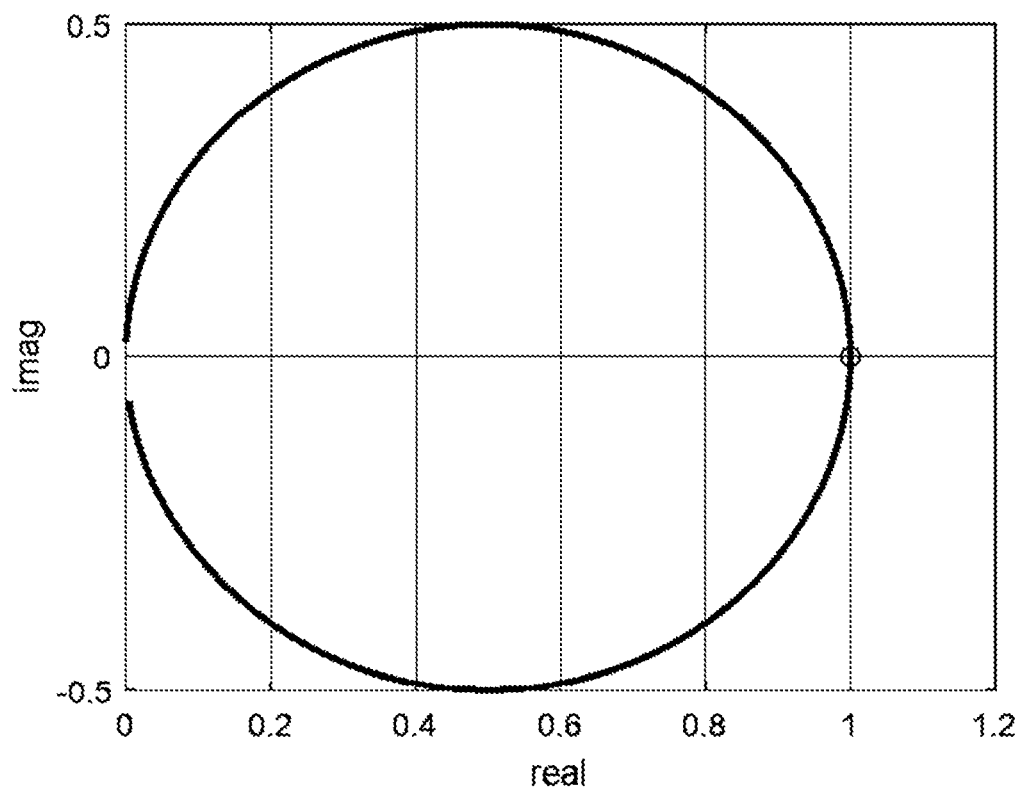
FIG. 5 is a Nyquist plot of the variable filter response.

An open loop Nyquist plot of $H_r(s)$ is shown in FIG. 5 for tuning with normalized $\omega_o = 1$. In this case $$f_d = \frac{1}{2\pi}\omega_o = \frac{1}{2\pi}$$

and the device line is the positive real axis such that Q enhancement occurs for G<1 but the AFF is unstable for G>1.

Generally speaking, the AFF may be stable for high Q enhancement when G becomes close to 1. This is a result of the magnitude of the Nyquist contour shown in FIG. 5 being a maximum magnitude at the intercept point with the device line.

Implementation of Fast Resonant Frequency Switching

Figure 6:
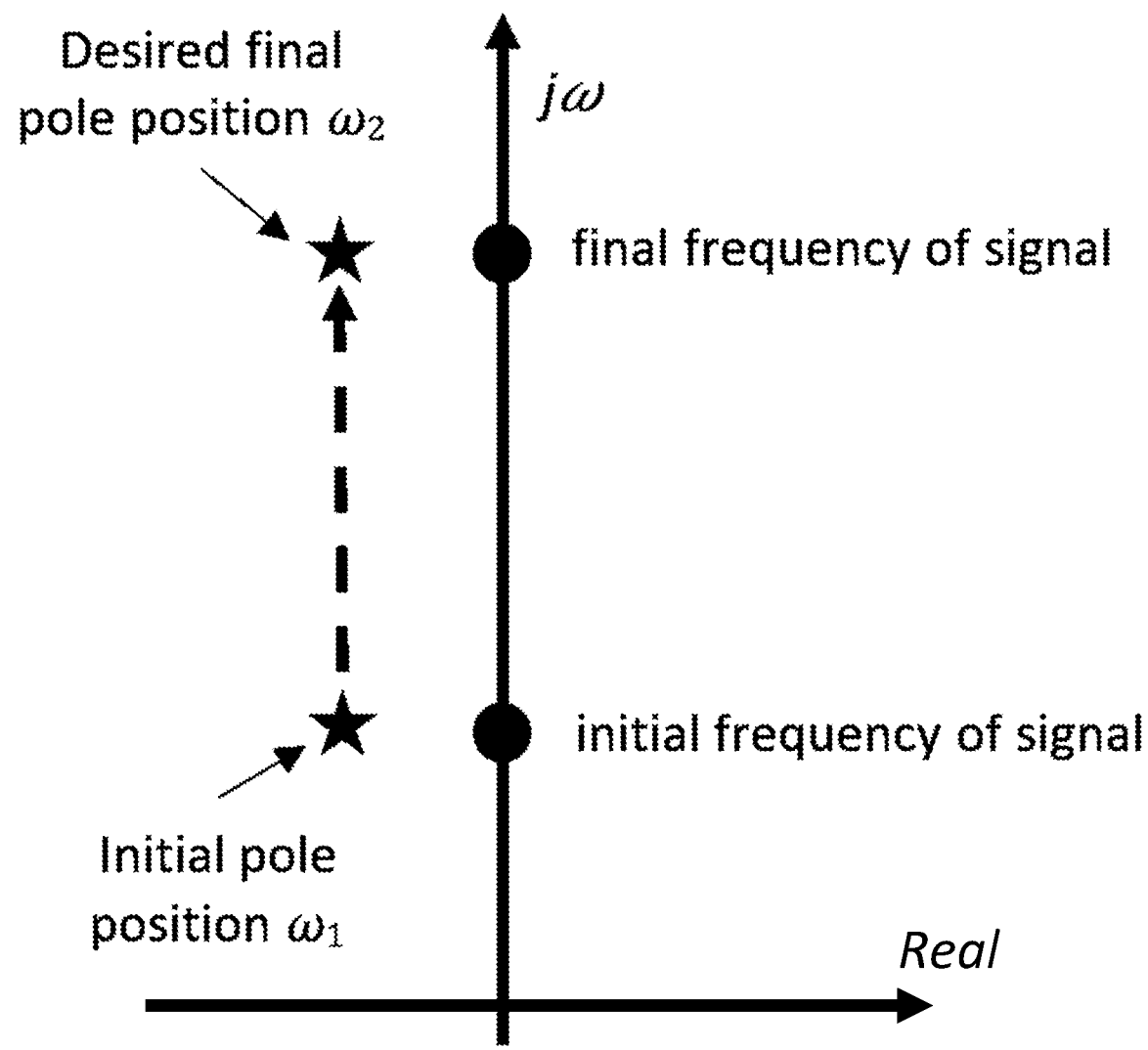
FIG. 6 is an s-plane plot showing a change in pole position of a variable filter from an initial pole position to a final pole position.

In general, a highly selective filter involves pole Q's that are very high. Hence it may take many RF cycles to build up the signal as the variable filter is changed to a new pole position, as represented by FIG. 6. Likewise, it will take a while to extinguish or quench the signal corresponding to a previous position of the filter. As used herein, quenching the signal, or quenching the frequency, refers to reducing the resonant energy within the frequency response of that signal, or in other words, reducing the spectral energy density of the resonator. FIG. 6 illustrates a high-Q pole that is moved from an initial position along the jω axis to a final position, synchronous with the change of frequency of the incoming signal.

An important issue with the analysis of this pole change is to assure that frequency and time domain analysis are not confused. A time domain analysis may be adopted as the pole of a resonator is only meaningful when the pole is static. This can be modified by assuming a quasi-static pole of quality factor Q that is slowly transitioning from one state to another state relative to the signal frequency. The term "slowly transitioning", means that the time constant associated with the pole change is much longer than $1/(Qf_c)$ of the pole. If the Q is several thousand and the frequency is, say, 1 GHz, then this time constant is on the order of microseconds.

Hence, a fast-moving pole cannot be meaningfully described as the transition neatly outlined in FIG. 6. However, if, for example, a pole of Q=1000 undergoes a transition completed in 10 microseconds and the frequency is 10 GHz, then it is reasonable to approximate the pole as quasi-static. In the following, for simplicity poles will be described as being moved. However, note that based on the current discussion, this is an approximate model. In applications where the speed of pole transition is fast, a more detailed analysis may be appropriate.

Increased Switching Speed

As discussed above, the resonant energy makes it difficult to tune a variable filter from a first frequency to a second frequency. By Q spoiling the variable filter to reduce the resonant energy prior to tuning the variable filter, the switching time may be reduced.

Figure 7:
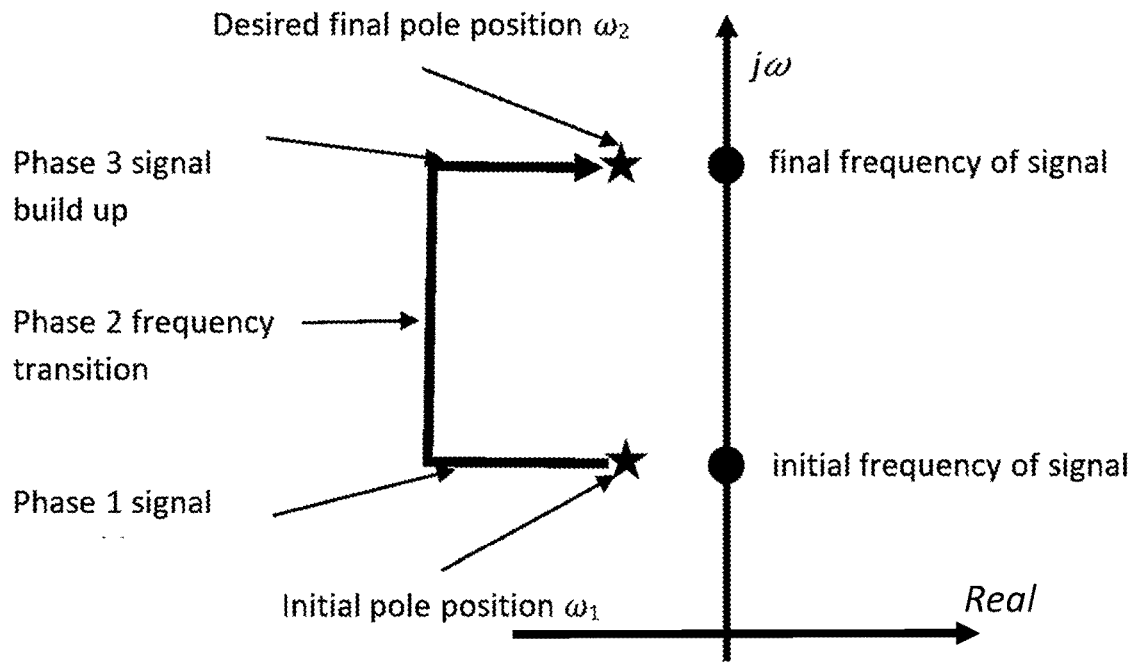
FIG. 7 is an s-plane plot of a path for changing the pole position of a variable filter.

Referring to FIG. 7, an example is shown in which, instead of the direct transition shown in FIG. 6, an indirect transition may be performed, which may be described using three phases:

Phase 1: The first is a signal quenching phase where in the pole is quickly moved deeper into the LHP. This quickly extinguishes the signal by reducing the in-circuit energy spectral density within the resonator. In this way, the signal can be extinguished very quickly, and may be considered almost instantaneous relative to the overall switching time, depending on the amount by which Q is reduced.

Phase 2: In phase two, the frequency transition may be accomplished relatively quickly as the pole has very low Q.

Phase 3: In phase three, the signal at the new frequency is built up by making the transition from a low Q to a higher Q. The buildup may be accomplished relatively fast as it occurs during the transition since the variable filter is at the correct frequency.

Figure 8:
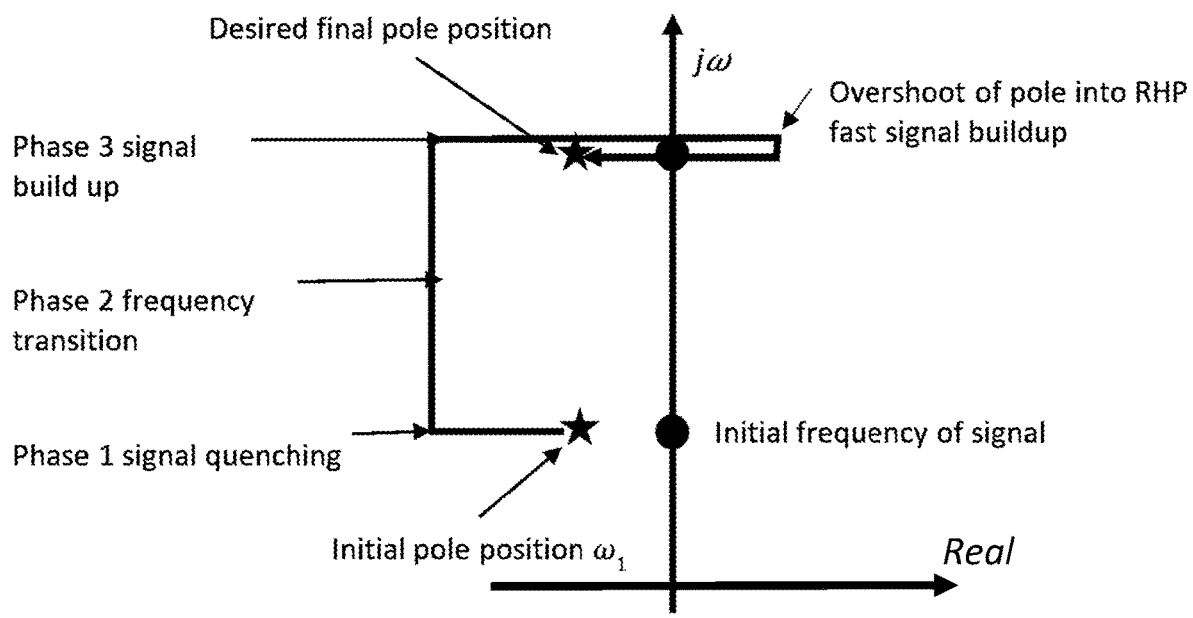
FIG. 8 is an s-plane plot of an alternate path for changing the pole position of a variable filter.

In another example, referring to FIG. 8, the build-up that occurs in Phase 3 may be accelerated by pushing the pole momentarily to the right of the desired pole location, and preferably into the right-hand s-plane, before coming back into the left-hand plane. This may be done by applying a gain that is sufficient to push the resonator into an oscillation state in the right-hand plane, such that the resonator energy increases more quickly.

Figure 9:
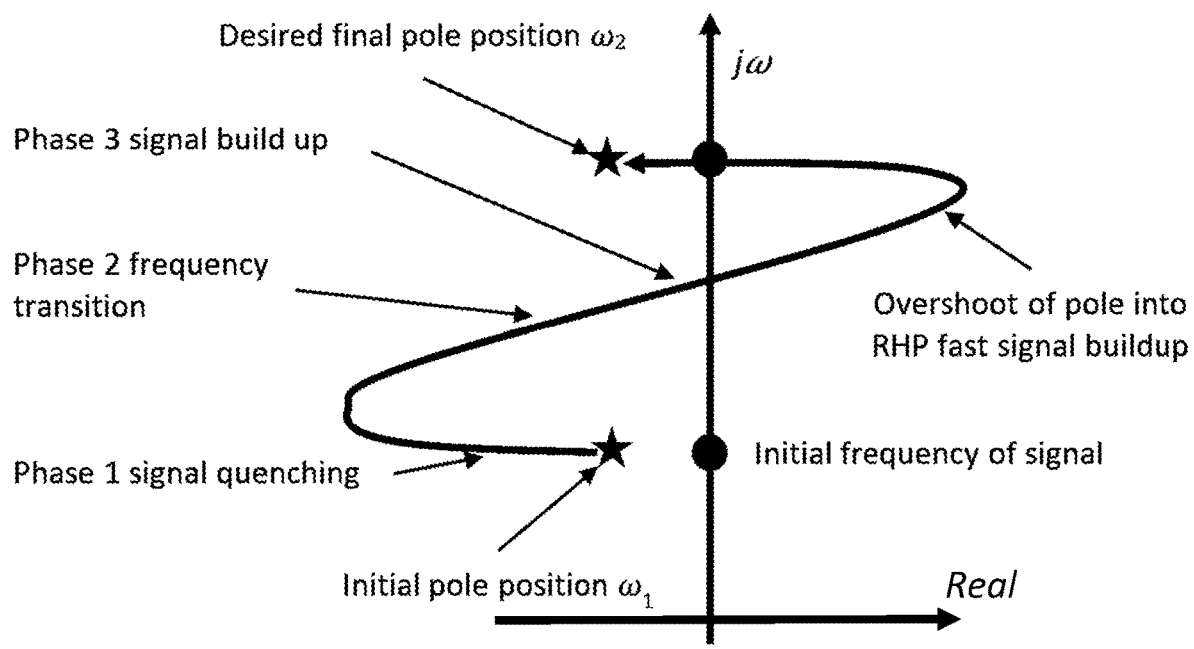
FIG. 9 is an s-plane plot of a further alternate path for changing the pole position of a variable filter.
Figure 10:
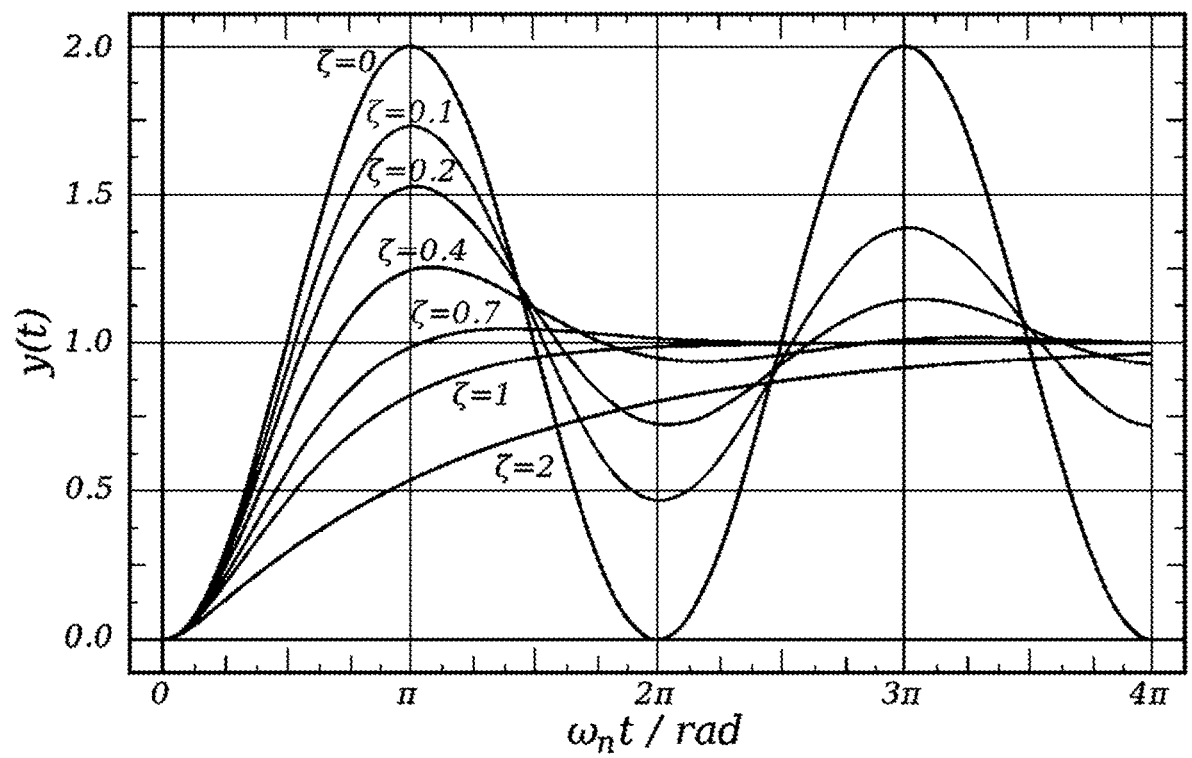
FIG. 10 is a plot depicting signal behavior at various damping ratios.

Referring now to FIG. 9, the process may be further generalized. This involves the charge states of the resonator capacitors, and as such these capacitors may be any suitable type, such as varactors sized for direct digital control without the need for a DAC, switched capacitor banks, or a combination of the two. Generally speaking, it is the initial and final charge state, rather than the type of capacitor, that is important. One example of a generalized fast switching process is described below:

Phase 1: Phase 1 may be represented as a time dependent transition to low Q as the pole moves away from the jω axis. In keeping with the discussion above relative to quasi-static, the transition time may be approximately $10\omega_1$. As indicated above, by reducing the energy spectral density of the resonator, this quickly extinguishes, or quenches, the signal. This transition may be accelerated in one example by a control signal that activates a switch that connects the resonator capacitor to ground. For example, linear SOI RF switches are known in the art that can switch on the order of a nanosecond. If used, this dump of the capacitor initial energy to ground may be accomplished with a critically damped circuit, as illustrated in FIG. 10, in order to provide a reduced transition time. This may not be preferred as energy is lost that would need to be replaced later in the process.

Phase 2: Phase two may be implemented as a two-step process. With the resonator at low spectral energy density, the first step is switching the capacitance to a new capacitance value yielding the desired resonant frequency. The longest time in this process may be changing the bias of varactors, where use of inductive elements in the bias control circuit may slow the switching speed. The second step of Phase 2 involves simultaneously increasing the feedback gain as the charge on the resonant capacitor builds up to provide the target capacitance. This gain increase may overshoot the pole and drive the new resonator into an oscillation state in the right-hand plane as shown in FIG. 9.

Phase 3: In phase three, the feedback gain may be reduced to bring the pole position out of the right-hand plane and back to the desired position in the left-hand plane at $\omega_2$ with the desired Q.

In each phase, the amount and rate at which the gain and/or frequency are adjusted may be varied to optimize the switching speed.

The primary objective of Phase 3 is to achieve a critical damping type response in reaching the desired final pole position $\omega_2$ with the desired Q. Critical damping, for reference, is presented notionally in FIG. 10 by the ζ=0.7 line reaching stability in a time:

$$t = \frac{2\pi}{\omega_2}$$

By using the method outlined in this disclosure, switching and settling times on the order of 100 nanosecond or less. In other examples, the switching time may be 50 nanoseconds or less. This may depend at least in part on the initial and final frequency and Q of the variable filter, hardware constraints, etc.

To make the AFF able to quickly change the selection of the signal instance it may be beneficial to have the filter resonators switch state very quickly. With conventional tunable resonators this may be a problem as the Q is generally fixed and to change state there would be a blending or overlap of the old and new signal instance. However, as the AFF described herein is comprised of variable filter components that use Q enhancement, it is possible to drive the Q-enhanced pole further into the left-hand plane, thereby quickly quenching the old signal instance. Then the frequency of the new desired signal instance may be tuned, and then the signal may be allowed to build up quickly, which may involve driving the pole to the right of the final state, closer to the jω axis, to accelerate the build-up of energy in the resonator, after which the circuit may be adjusted to return to the desired Q-enhanced state for the balance of the dwell time of the new signal instance.

Timing Considerations

Referring to FIG. 6, the present discussion relates to switching a bandpass filter from a frequency of $\omega_1$ to $\omega_2$. The time required for this is based on the following factors: (1) the time required to change the resonant frequency of the resonator frequency tuning device from one bias state, corresponding to $\omega_1$, to a new bias state corresponding to $\omega_2$; and (2) the time required to dissipate the energy of the signal at $\omega_1$ and to build up the energy of the signal at $\omega_2$.

Where the resonator includes a varactor diode, the bias determines the capacitance and therefore the resonant frequency. As such, the bias of the device as in the first factor may be completed in about 10 nsec. It may be faster, but the varactor bias network may begin to load the resonator dropping the Q. Hence a typical fast bias change would be on the order of 10 nsec.

With respect to the second factor, the decay of energy at $\omega_1$ is on the order of Q RF cycles, where Q is the enhanced Q of the pole. As an example, if this Q is 1000 and the frequency of $\omega_1$ corresponds to 1 GHz, then the time to deplete the energy stored will be about 1 microsecond. Likewise, the energy must be built up at the new frequency of $\omega_2$. If Q is the same, as it is in FIG. 6, then the time to build up the energy at the new $\omega_2$ frequency will be roughly the same as the time to deplete the energy.

However, the decay of energy at $\omega_1$ and the buildup of energy at $\omega_2$ are processes that occur at the same time. Hence Q RF cycles at the new frequency of $\omega_2$ is a reasonable approximation.

From another perspective, what actually happens is that the signal energy at $\omega_1$ is transformed into energy at $\omega_2$ as the varactor diode bias is changed. However, the phase of the signal at $\omega_1$ that gets transformed into the frequency of $\omega_2$ is independent of the phase of the input signal into the filter at $\omega_2$. In any event, the transient relates to the level of the signal at $\omega_2$ as it asymptotically reaches the amplitude level and phase corresponding to this input signal. This transient takes about Q periods of $\omega_2$ to complete.

Instead of the direct trajectory as in FIG. 6, the switching time may be reduced by taking an indirect path, examples of which are shown in the state diagrams depicted in FIG. 7 through 9. A preferred trajectory is shown in FIG. 9.

The bias of the filter loop gain and resonator frequency may be approximated as being arbitrarily fast in comparison to the time required for the energy corresponding to $\omega_1$ to decay and the new energy corresponding to the signal at $\omega_2$ to build up. It may also be assumed that the signal at $\omega_2$ is applied as soon as the filter transition from $\omega_1$ to $\omega_2$ is initiated. As such, the switching time relates primarily to the time required for the filter to settle at the $\omega_2$ state corresponding to the new applied input at $\omega_2$. The $\omega_1$ signal decays very quickly as the bias pushes the pole into the left-hand plane. At this point (i.e. after phase 1 in FIG. 9) the new signal at $\omega_2$ dominates as the Q of the filter is very low. Then the trajectory of the pole may be designed to provide high gain at $\omega_2$ as fast as is practical. To build up the signal quickly at $\omega_2$, the pole may be pushed into the right-hand plane. Doing this, the build-up the $\omega_2$ signal will occur faster than the Q periods at $\omega_2$ as considered in FIG. 6.

It may be detrimental to linger in the right-hand plane before completing the frequency transition trajectory at the desired final pole position because 1) the amplitude of the $\omega_2$ signal will be too high, and 2) the phase of the $\omega_2$ signal may off by up to 180 degrees. With this, the switching time will require about Q periods of additional transient before settling at the response at $\omega_2$ corresponding to the applied input.

Hence the timing of the frequency transition trajectory is important. With an appropriate trajectory, the time required for the final $\omega_2$ transition may be a fraction of the Q periods at $\omega_2$ that would otherwise be required.

In another example, an initial narrowband signal may be centered around col, and then at t=0, switched to a new signal centered around $\omega_2$. At or around t=0, Q spoiling starts such that the energy of the first signal residing in the resonator begins to decay. Meanwhile, the second signal starts to build up as the resonator pole is moved toward the second frequency. Once the first signal has sufficiently decayed, the second signal is then Q enhanced to cause it to build up more quickly, as discussed above. Any residual component at $\omega_1$ is mapped into $\omega_2$, but as there is no new signal input at col, no new energy added. The greater the amount of residual energy of the first signal that is mapped into $\omega_2$, the longer it takes to decay, as the pole at $\omega_2$ now has a high Q. As such, it is beneficial to select the trajectory of the pole such that the signal energy at $\omega_1$ is sufficiently dissipated before the $\omega_2$ pole is Q-enhanced to improve the switching speed.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings but should be given the broadest interpretation consistent with the description as a whole.

What is claimed is:

1. A method of switching a resonant frequency of a variable filter from an initial frequency to a desired frequency, the variable filter comprising an active feedback bandpass filter having a tunable frequency and a variable Q, the method comprising the steps of:
    with the variable filter operating at the initial frequency and an initial Q, Q spoiling the variable filter toward a low-Q state; and
    tuning the variable filter toward the desired frequency and Q-enhancing the variable filter from the low-Q state to achieve a desired filter response.

2. The method of claim 1, wherein the variable filter comprises a signal loop connected between a signal input and a signal output, the signal loop comprising at least a tunable resonator and a variable gain block.

3. The method of claim 2, wherein Q-spoiling the variable filter comprises reducing a gain factor of the variable gain block.

4. The method of claim 1, wherein the variable filter is tuned toward the desired frequency as the variable filter is Q-enhanced from the low-Q state.

5. The method of claim 1, wherein the step of Q-enhancing the variable filter comprises Q-enhancing the variable filter to cause the variable filter to operate in an oscillation state, and then decreasing the Q to achieve the desired filter response.

6. The method of claim 1, wherein the variable filter is Q-spoiled sufficiently to permit the variable filter to switch from the initial frequency to the desired frequency within a time period of 100 nanoseconds or less.

7. A method of switching a resonant frequency of a variable filter from an initial frequency to a desired frequency, the variable filter comprising an active feedback bandpass filter having a tunable frequency and a variable Q, wherein in operation, the variable filter is described by one or more poles in an s-plane plot having a real axis and an imaginary axis, the method comprising the steps of:
    with the variable filter operating at an initial pole location in the s-plane plot, Q-spoiling the variable filter to cause one or more poles to move away from the imaginary axis and toward a low-Q state; and
    tuning the tunable frequency and controlling the variable Q to achieve a desired pole location corresponding to the desired frequency and a desired Q.

8. The method of claim 7, wherein achieving the desired pole location comprises Q-enhancing the variable filter relative to the low-Q state.

9. The method of claim 7, wherein the tunable frequency is tuned toward the desired frequency while the variable filter is Q-enhanced from the low-Q state.

10. The method of claim 7, wherein the variable filter comprises a signal loop connected between a signal input and a signal output, the signal loop comprising at least a tunable resonator and a variable gain block, and wherein Q-spoiling the variable filter comprises reducing a gain factor of the variable gain block and Q-enhancing the variable filter comprises increasing a gain factor of the variable gain block.

11. The method of claim 10, wherein the desired pole location is achieved by increasing the gain factor of the variable gain block to cause the tunable resonator to operate in an oscillation state, and then decreasing the gain factor to a resonant state of the tunable resonator.

12. The method of claim 7, wherein the low-Q state is selected to permit the variable filter to switch from the initial frequency to the desired frequency within a time period of 100 nanoseconds or less.

13. A variable filter, comprising:
    an active feedback bandpass filter (AFF) comprising a signal loop connected between a signal input and a signal output, the signal loop comprising at least a tunable resonator and a variable gain block, the signal loop generating a filter response;
    a controller connected to tune a frequency of the tunable resonator and vary a gain factor of the variable gain block, the controller being programmed to tune the filter response of the signal loop from an initial frequency to a desired frequency by:
        Q-spoiling the AFF toward a low-Q state;
        tuning the tunable resonator toward the desired frequency; and
        Q-enhancing the AFF from the low-Q state to achieve a desired filter response.

14. The variable filter of claim 13, wherein Q-spoiling the AFF comprises reducing a gain factor of the variable gain block.

15. The variable filter of claim 13, wherein the controller is programmed to tune the tunable resonator toward the desired frequency while Q-enhancing the AFF from the low-Q state.

16. The variable filter of claim 13, wherein the controller is programmed to Q-enhance the AFF from the low-Q state to cause the AFF to operate in an oscillation state, and then decrease the gain factor to achieve the desired Q at the desired frequency.

17. The variable filter of claim 13, wherein the low-Q state is sufficient to permit the AFF to switch from the initial frequency to the desired filter response within a time period of 100 nanoseconds or less.

* * * * *